United States Patent [19]

Parker

[11] Patent Number: 4,912,844
[45] Date of Patent: Apr. 3, 1990

[54] METHODS OF PRODUCING PRINTED CIRCUIT BOARDS

[75] Inventor: Frederick Parker, San Diego, Calif.

[73] Assignee: Dimensional Circuits Corporation, San Diego, Calif.

[21] Appl. No.: 230,460

[22] Filed: Aug. 10, 1988

[51] Int. Cl.⁴ .......................... H05K 3/02; H05K 3/04
[52] U.S. Cl. ......................................... 29/848; 29/837
[58] Field of Search .................. 29/846, 848, 837; 174/68.5

[56] References Cited

U.S. PATENT DOCUMENTS

| | | | |
|---|---|---|---|
| 2,955,351 | 10/1960 | McCreadie | 29/848 |
| 2,986,804 | 6/1961 | Greenman et al. | 174/68.5 |
| 3,990,142 | 11/1976 | Weglin | 29/848 |
| 4,363,930 | 12/1982 | Hoffman | 29/848 |
| 4,374,457 | 2/1983 | Wietch, Jr. | 29/848 |
| 4,614,837 | 9/1986 | Kane et al. | 29/846 |

Primary Examiner—Timothy V. Eley
Attorney, Agent, or Firm—Ellsworth R. Roston; Charles H. Schwartz

[57] ABSTRACT

A punch has a planar surface and raised portions extending from the planar surface. First ones of the raised portions may have a height of approximately 3–25 mils. Second ones of the raised portions may have a greater depth than the first raised portions. The punch may be heated and/applied to the planar surface of a substrate which may also be pre-heated and which has properties of becoming deformed when subjected to heat and pressure. The punch produces cavities and grooves in the substrate at the positions of the raised portions. Electrical components may be disposed in the cavities in the substrate and an electrically conductive material may be disposed in the grooves to communicate with the electrical components. The raised portions in the punch may be provided by printed circuit techniques or by matching or by laser techniques. Alternatively, a foil may be disposed on the planar surface of the punch and the raised portions of the punch. When the punch is applied to the substrate, the grooves and cavities are formed and the foil is transferred to the substrate on the planar surface and in the grooves and cavities in the substrate. The portions of the foil on the planar surface of the substrate may then be removed as by printed circuit techniques or machining or laser techniques so that only the portions of the foil in the grooves and the cavities remain. If desired, these portions of the foil may be electrically plated.

19 Claims, 5 Drawing Sheets

METHODS OF PRODUCING PRINTED CIRCUIT BOARDS

This invention relates to printed circuit boards and more particularly relates to methods of making printed circuit boards having grooves for receiving electrical leads and cavities for receiving electrical components.

Printed circuit boards have been in use for decades to provide electrical circuitry. The boards generally include a thin substrate made from a suitable electrically insulating material such as a ceramic or an epoxy-glass composite. Thin electrical leads are disposed on one or both surfaces of the substrate and electrical components such as resistors and capacitors are disposed on the printed board and are connected electrically to the thin electrical leads.

The printed circuit boards now in use have certain significant disadvantages. For example, since the thickness of the electrical leads is relatively small, the leads have to be made relatively wide in order to make the electrical resistance of the leads as low as possible. This tends to limit the amount of electrical circuitry which can be provided on a printed circuit board of any preselected size. Alternatively, the size of the printed circuit can be increased to provide the desired circuitry on the board even with the relatively wide dimensions of the leads.

The printed circuit boards now in use also have other significant disadvantages. The electrical components such as the resistors and capacitors on the printed circuit board have to be connected electrically as by soldering the electrical leads on the board. Such soldering is time consuming, particularly when a considerable number of such soldering connections have to be made to complete the circuitry on a board. Furthermore, the soldering has to be quite precise. Otherwise, proper electrical connections will not be made between the electrical leads and the components, or short circuits will be established by drippings of solder between different electrical leads or between different terminals on adjacent components.

Techniques have recently been devised for improving the methods of manufacturing printed circuit boards. For example, U.S. Pat. No. 3,899,091 discloses and claims a printed circuit board in which grooves are disposed in the surface of the board and in which electrically conductive material such as solder is disposed in such grooves. Cavities are also provided in the printed circuit board to receive electrical components, preferably in a tight fit relationship in the cavities. The solder in the grooves then communicates electrically with the electrical components in the cavities. By providing this relationship, the widths of the grooves can be made relatively small. This is particularly true when the grooves are provided with a relatively great depth.

This invention provides a method of expediting the manufacture of printed circuit boards with grooves and cavities as discussed in the previous paragraph. The invention is advantageous in insuring the precise duplication of the cavities and grooves in successive boards. The invention is also advantageous in providing such precise duplication of the cavities and grooves in the boards at a minimal cost in the production of printed circuit boards in comparison to the methods used to manufacture such boards in the prior art.

In one embodiment of the invention, a punch has a planar surface and raised portions extending from the planar surface. First ones of the raised portions may have a height of approximately 3–25 mils. Second ones of the raised portions may have a greater depth than the first raised portions.

The punch may be heated and applied to the planar surface of a substrate which may also be pre-heated and which has properties of becoming deformed when subjected to heat and pressure. The punch produces cavities and grooves in the substrate at the positions of the raised portions. Electrical components may be disposed in the cavities in the substrate and an electrically conductive material may be disposed in the grooves to communicate with the electrical components.

The raised portions in the punch may be provided by printed circuit techniques or by machining or by laser techniques. Alternatively, a foil may be disposed on the planar surface of the punch and the raised portions of the punch. When the punch is applied to the substrate, the grooves and cavities are formed and the foil is transferred to the substrate on the planar surface and in the grooves and cavities in the substrate. The portions of the foil on the planar surface of the substrate may then be removed as by printed circuit techniques or machining or laser techniques so that only the portions of the foil in the grooves and the cavities remain. If desired, these portions of the foil may be electrically plated.

Figure 1:
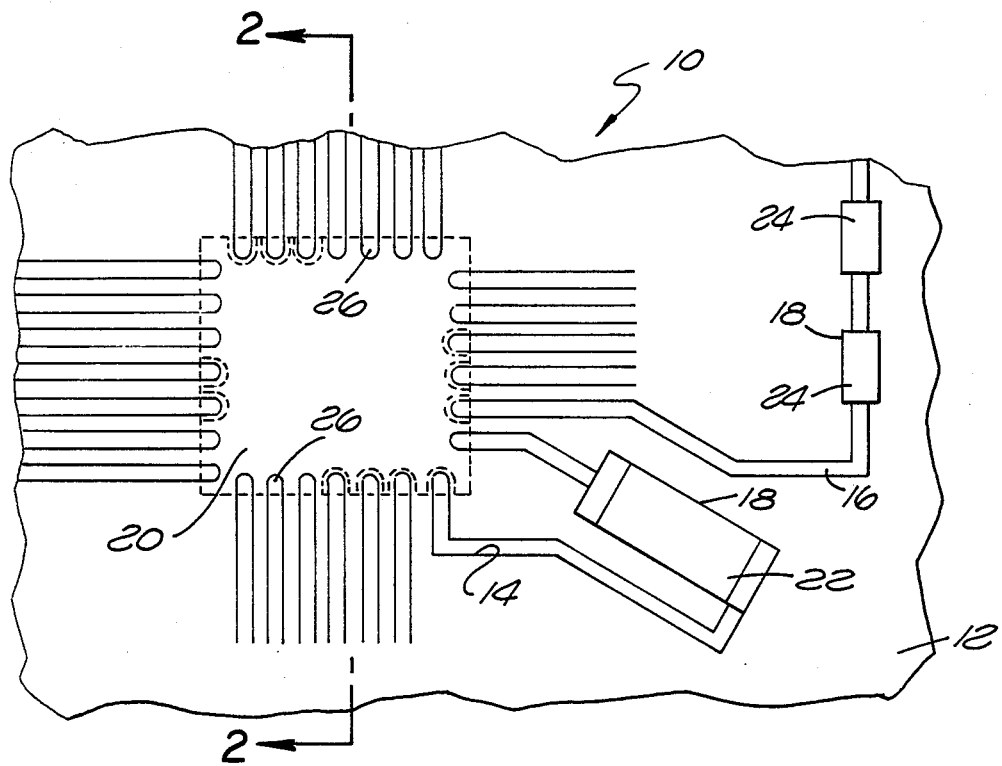
FIG. 1 is a fragmentary top plan view of a printed circuit board constituting one embodiment of the invention.
Figure 2:
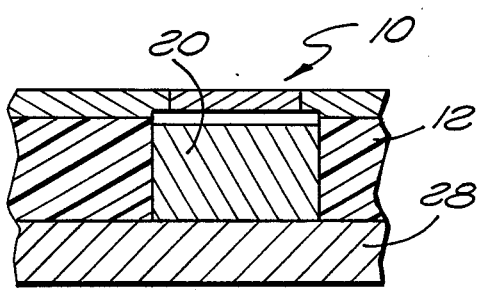
FIG. 2 is a fragmentary sectional view of the printed circuit board shown in FIG. 1 and is taken substantially on the line 2—2 of FIG. 1.
Figure 3:
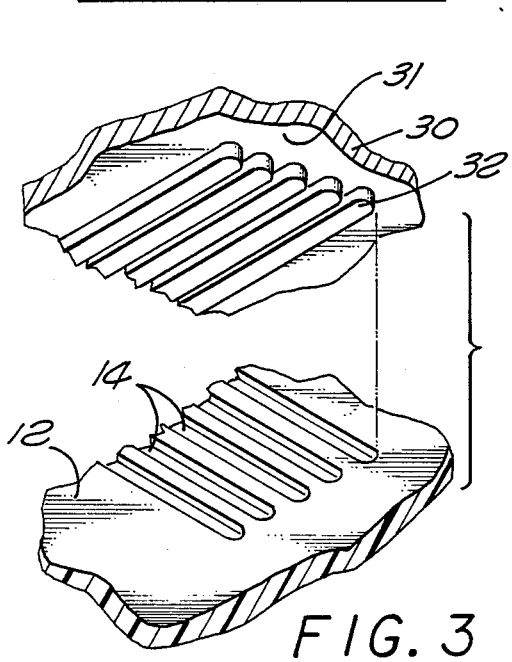
FIG. 3 is a perspective view of one embodiment of a punch which may be used to produce the printed circuit board shown in FIGS. 1 and 2.
Figure 4:
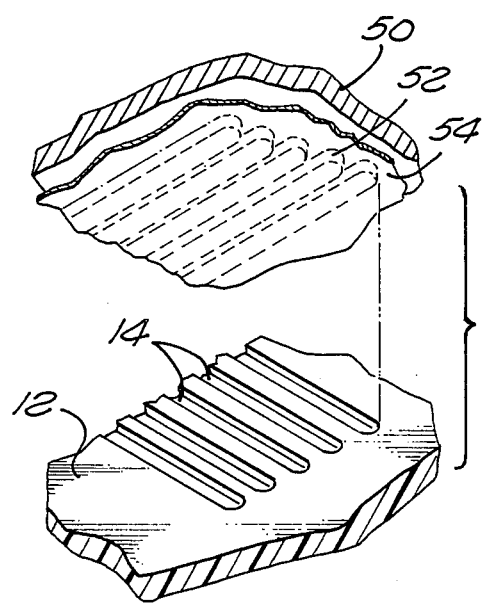

FIG. 4 is a perspective view of an alternate embodiment of a punch which may be used to produce the printed circuit board shown in FIGS. 1 and 2; and FIGS. 5–8 show alternate methods of using a selected one of the punches shown in FIGS. 3 and 4 to produce the printed circuit board shown in FIGS. 1 and 2.

FIGS. 1 and 2 show a printed circuit board, generally indicated at 10, which is constructed in accordance with the methods of this invention. The printed circuit board 10 includes a substrate 12 made from a suitable material such as a ceramic or an epoxy-glass material such as is now used on printed circuit boards of conventional construction. The substrate 12 may also be made of high temperature thermoplastic or thermosetting materials. The substrate 12 preferably has a relatively small thickness and substantially parallel planar surfaces.

Grooves 14 are disposed in one or both of the parallel surfaces of the substrate 12. The grooves 14 are preferably provided with depths in the order of three thousandths of an inch (0.003") to twenty five thousandths of an inch (0.025") but they may also be provided with different depths. The depth of the grooves is preferably at least as great as the width of the grooves. An electrically conductive material 16 such as solder is disposed in the grooves 14. The solder 16 may fill the grooves or partially fill the grooves or may be disposed essentially only on the walls of the grooves.

Cavities 18 are also provided in one or both of the parallel surfaces of the substrate 12. The cavities 18 are provided with greater depths than the grooves 14. Electrical components are adapted to be disposed in the cavities 18, preferably in a tight fit with the walls of the cavities. The electrical components may include transistors such as a transistor 20, capacitors such as a capacitor 22 and resistors such as resistors 24. The electrical components such as the transistor 20, the capacitor 22 and the resistors 24 may be provided with electrical leads or may be constructed so as to have terminals without electrical leads. It will be appreciated that other electrical components may be disposed on the substrate above the planar surfaces of the boards.

The grooves 14 are disposed to extend to the holes 18. In this way, the solder 16 in the grooves 14 establishes electrical continuity with the terminals or leads of the transistor 20, the capacitor 22 and the resistors 24. In the case of the transistor 20, the transistor is provided with a plurality of terminals or pads 26. The solder 16 is disposed in the grooves 16 to extend to the pads 26 and establish electrical continuity with the pads.

The transistor 20 may generate a significant amount of heat in operation. A heat sink 28 may be disposed below the transistor in one of the cavities 18 to receive heat from the transistor 20 and thereby prevent the transistor from overheating. As will be appreciated, heat sinks may also be disposed below other components to facilitate the transfer of heat from these components and thereby prevent the components from overheating.

Since the depths of the grooves 14 are preferably at least as great as the widths of the grooves and since the solder 16 can fill the grooves, the widths of the grooves can be made quite small while still retaining relatively low the electrical resistances of the leads formed by the solder. For any particular circuit, the size of the substrate 12 can accordingly be reduced in comparison to the size of the substrates which have previously been used. Alternatively, for a substrate of a given size, additional circuitry can be disposed on the substrate 12 by using the techniques of this invention. This is particularly true when it is considered that the provision of the cavities 18 in the substrate 12 and the disposition of the electrical components in the holes facilitate a compact arrangement of the electrical circuitry in and on the substrate.

As will be appreciated, the components such as the transistor 20, the capacitor 22 and the resistors 24 can be disposed horizontally or vertically in the cavities 18. A vertical disposition facilitates a connection of one terminal of the component at a first surface of the substrate and a connection of another (or the other) terminal of the component at the other surface of the substrate. A horizontal disposition of the component facilitates the connection of the terminals of the component at the same surface of the substrate 12.

By providing electrical connections to the different components by the solder 16 in the grooves 14, the provision of the electrical circuitry in and on the substrate 12 is simplified in comparison to the prior art. Furthermore, the structural integrity of the connections to the components is enhanced. This may be seen from the fact that, in the prior art, electrical leads have to be bonded to the different components on the substrate. This is time consuming. Furthermore, the chances of an improper connection are considerably magnified in the methods of the prior art when considered in relation to the methods of this invention. The difficulties and disadvantages of the methods of the prior art become especially aggravating when connections are made to a component such as a transistor since the transistor is small and has a considerably number of closely spaced electrical terminals such as the pads 26.

The grooves 14 and the cavities 18 can be formed by a number of different methods, all within the scope of the invention. In several of the different methods, a punch 30 is provided with a planar surface 31 and with raised portions 32 which are disposed and shaped to provide the grooves 14 and the holes 18 in the substrate 12. To produce the grooves 14 and the holes 18 in the substrate 12, the punch 30 is heated to an elevated temperature dependent upon the characteristics of the material forming the substrate 12 and is then pressed against the substrate. The combination of the heat and pressure causes the substrate 12 to be deformed so that the grooves 14 and the cavities 18 are formed in the substrate. Alternatively or in addition to the heating of the punch 30, the substrate 12 may also be heated to facilitate the deformation of the substrate when the punch 30 is applied against the substrate.

After the grooves 14 and the cavities 18 have been formed in the substrate 12, the punch 30 is removed from the substrate. Electrical components such as the transistor 20, the capacitor 22 and the resistors 24 may be disposed in the cavities 18 and solder 16 may be disposed in the grooves to communicate electrically with the electrical components. If desired, other electrical components may be disposed on the substrate 12 and may be connected to the solder 16 in the grooves to complete the electrical circuitry.

In one embodiment of the invention, a method as shown in FIG. 4 is provided for producing the printed circuit board 10. As a first step in this method, a mask is disposed on the punch 30. The punch 30 may be made from any material suitable for plating or the application of photosensitive or photoresist material. For example, the punch 30 may be made from steel or copper. The mask 40 may be made from a photosensitive material which is well known in the art of printed circuitry. The thickness of the photosensitive mask 30 may be in the order of three thousandths of an inch (0.003") to twenty five thousandths of an inch (0.025") to provide the grooves 30.

An image of the grooves 14 and the cavities 18 is then photoexposed on the mask 30. The techniques of, and the materials for, photoexposing the image of the grooves 14 and the cavities 18 on the mask 40 are well known in the art. The photoexposed portions of the mask 40 are then etched from the mask by materials and methods well known in the art to produce cavities in the mask at the positions of the grooves 14 and the holes 18 in the substrate 12. To produce the cavities 18, the cavities at the positions of the cavities may be machined to increase the depths of the cavities.

The cavities in the mask 40 are subsequently filled by plating the punch 30 with a material, such as a metal, suitable for hot forming. Plating materials well known in the art may be used. The plating may be accomplished by methods well known in the art. Typical plating materials may be nickel, copper, steel and/or chromium but other metals may also be used. The plating is controlled so that the plating material fills the cavities in the mask 40 to a level where the material is flush with the surface of the mask.

The remaining portions of the mask 40 are now removed by materials and methods well known in the field of printed circuitry. In this way, only the plating materials discussed in the previous paragraph remain on the punch 30. The punch 30 is then heated to an elevated temperature dependent upon the material of the substrate 12. As will be appreciated, this elevated temperature is below the melting temperature of the material forming the substrate 12. Preferably the elevated temperature approaches the melting temperature of the substrate 12 to facilitate the deformation of the substrate by the punch 30 such that the grooves 14 and the cavities 18 are formed.

As an alternative or in addition to the step discussed in the previous paragraph, the substrate 12 can be heated to an elevated temperature. This elevated temperature is below the melting temperature of the substrate 12 but approaches the melting temperature of the substrate to facilitate the deformation of the substrate by the punch for the formation of the grooves 14 and the cavities 18.

During the time that either or both the punch 30 and the substrate 12 are at the elevated temperature, the punch 30 is applied to the substrate to deform the substrate and produce the grooves 14 and the cavities 18. As will be appreciated, the punch 30 may be applied with some force to the substrate 12 to produce the grooves 14 and the cavities 18. The punch 30 is then removed from the substrate 12. The electrical components such as the transistor 20, the capacitor 22 and the resistors 24 are thereafter disposed in the associated ones of the cavities 18 in the substrate.

An electrically conductive material such as the solder 16 is subsequently disposed in the grooves 18 to communicate electrically with other grooves and with the electrical components. The disposition of the solder 16 preferably occurs with the solder in molten form. The solder can be disposed in the grooves 14 by techniques well known in the art. The solder can fill the grooves 14 or partially fill the grooves or be disposed only against the walls of the grooves. After the solder 16 has been disposed in the grooves 14, electrical components may be externally disposed on the substrate 12 and may be connected to different electrical leads represented by the solder in the individual grooves.

Figure 6:
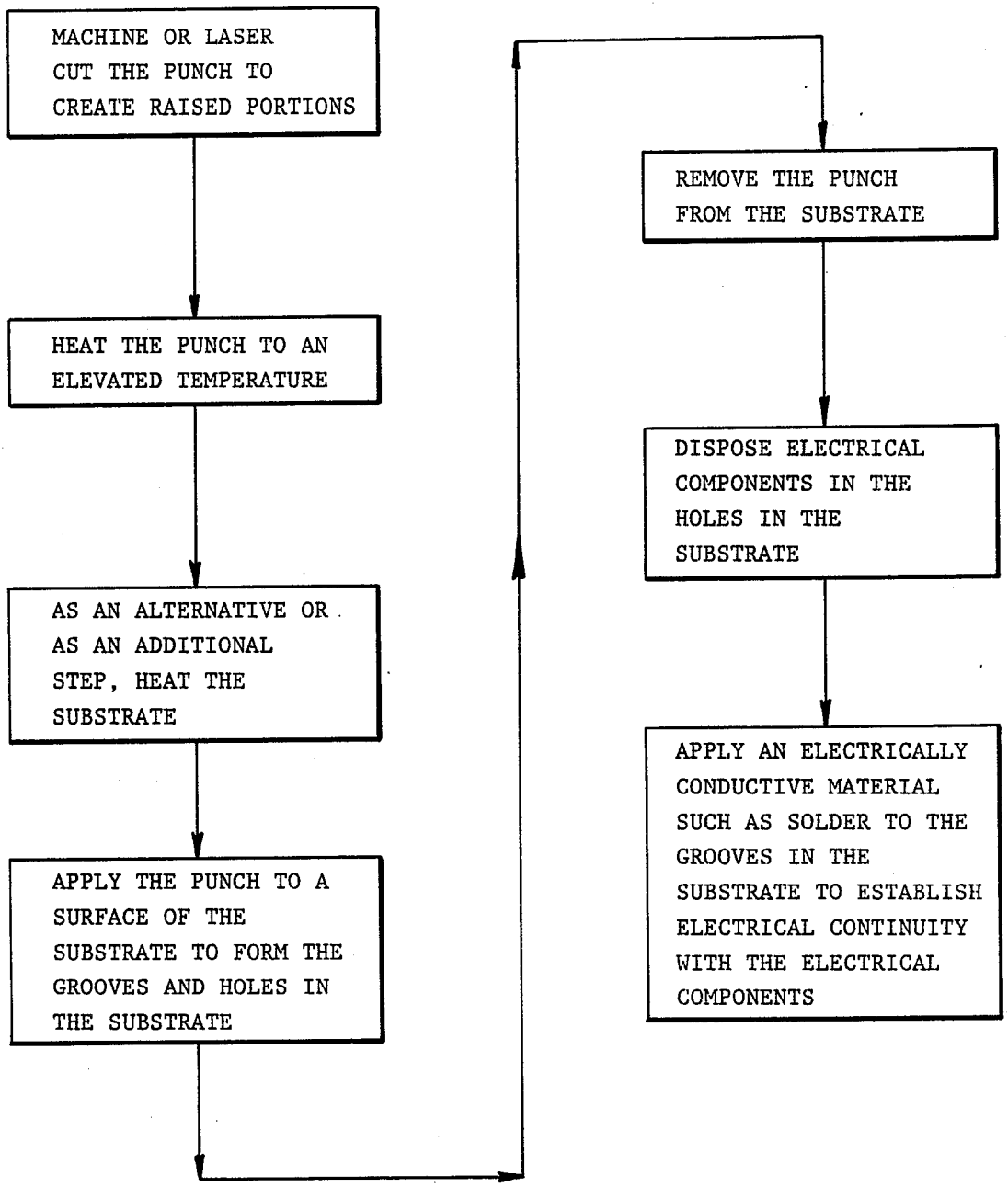

FIG. 6 sets forth the steps in an alternate method included within this invention. In the embodiment shown in FIG. 6, the projections for producing the grooves 14 and the cavities 18 in the substrate 12 may be produced in a punch as by machining. The punch is then heated and, alternatively or as an additional step, the substrate 12 may also be heated. While the punch and/or the substrate 12 are at an elevated temperature, the punch is then applied to the substrate 12 to form the grooves 14 and the cavities 18. After the punch 50 has been removed from the substrate 12, the electrical components are disposed in the cavities 18 in the substrate and solder 16 is disposed in the grooves 14 in the substrate.

Figure 7:
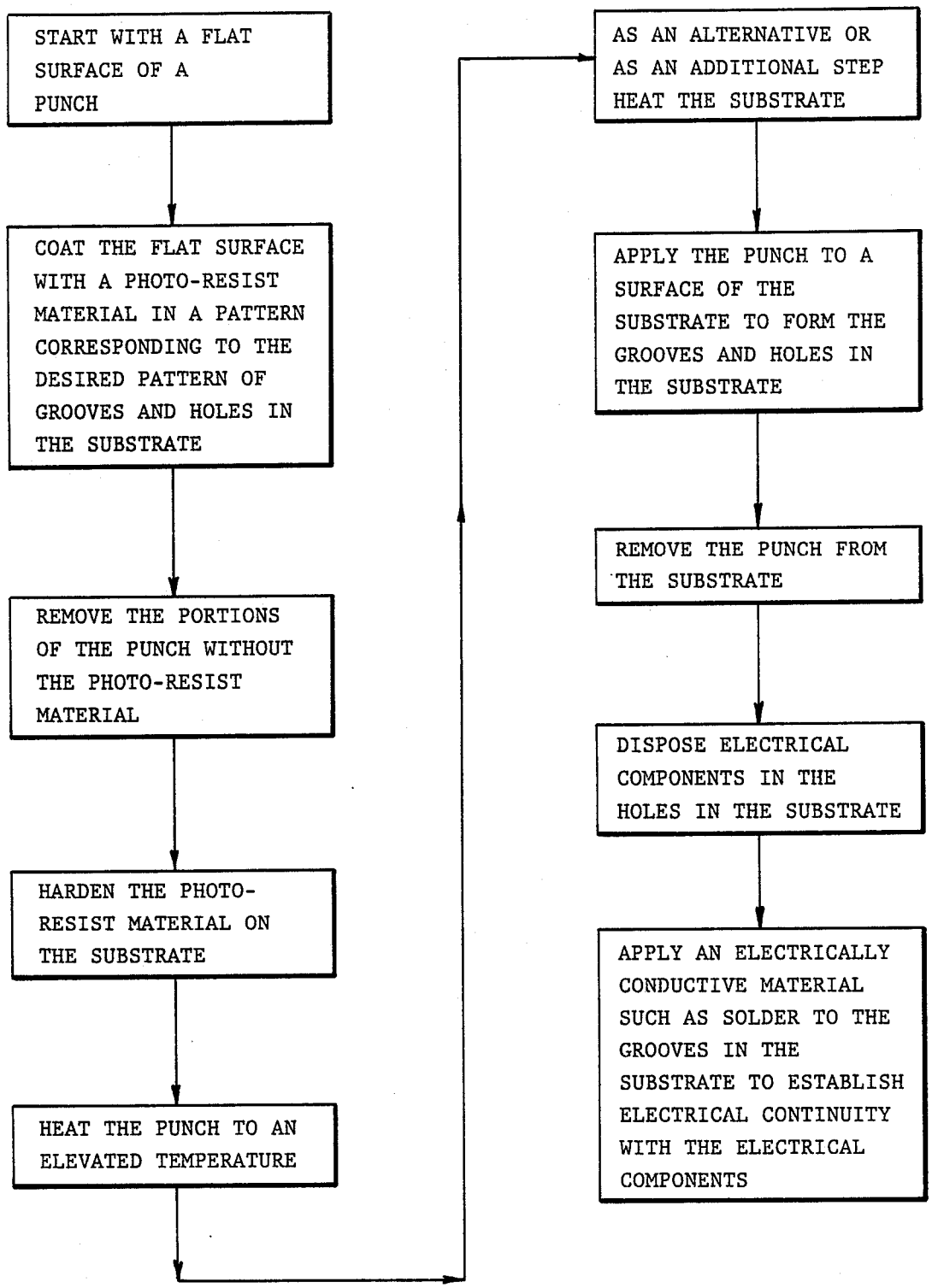

FIG. 7 illustrates another alternative method included within this invention. In the method shown in FIG. 7, a flat plate made from a suitable material such as copper, steel or nickel is attached to a punch. The plate is then coated with a photoresist material in a pattern corresponding to the pattern of the grooves 14 and the cavities 18 in the substrate 12. The coating of the plate with a photoresist material is well known in the art.

The portions of the plate without the photoresist material are then removed from the plate by materials and methods well known in the art. The photoresist material on the plate is thereafter hardened by techniques well known in the art. In this way, the punch is provided with plated material, hardened, in a pattern corresponding to the pattern of the grooves 14 and the cavities 18 in the substrate 12.

Figure 5:
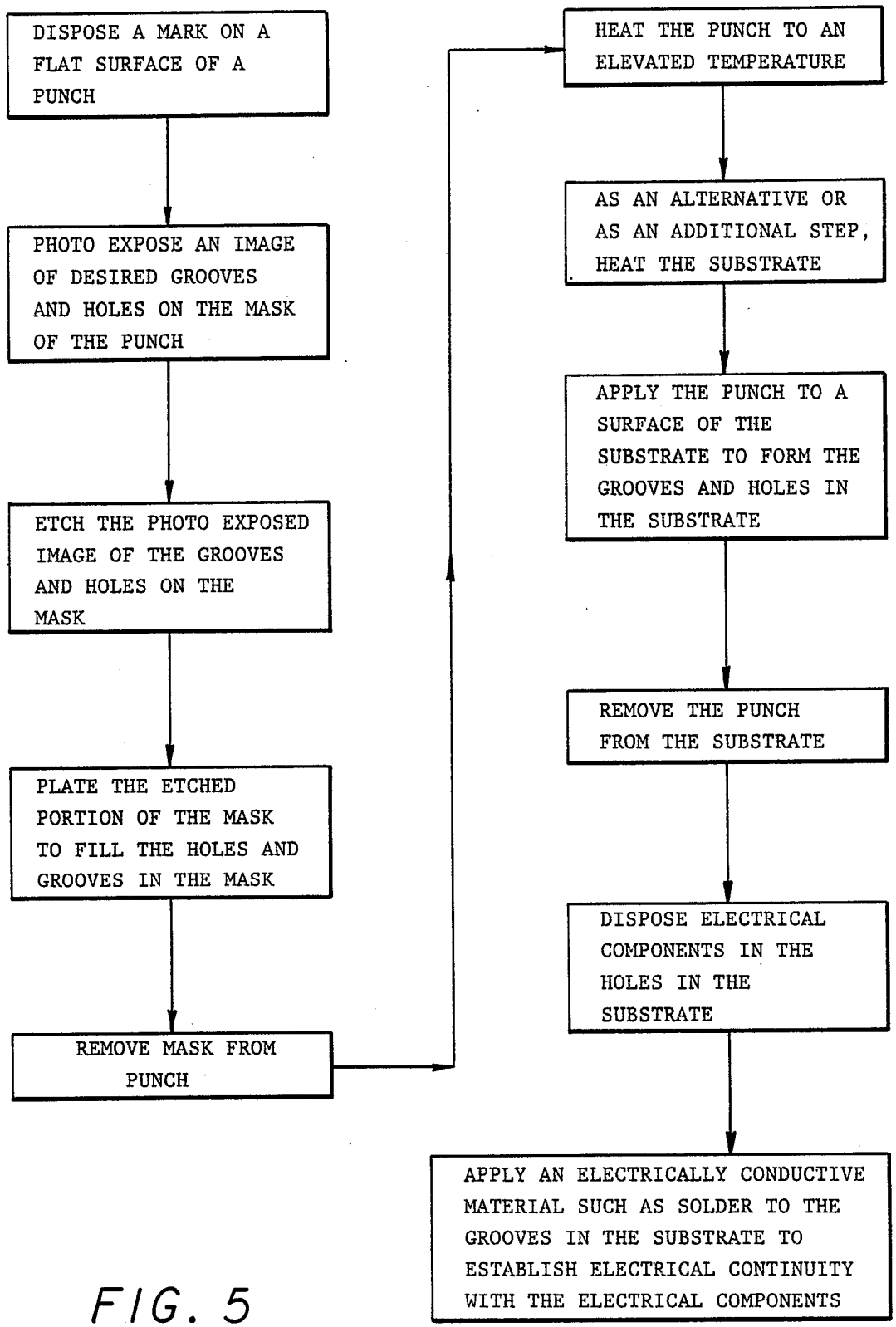

The remaining steps in the method shown in FIG. 7 correspond to steps in the method shown in FIG. 5 and discussed above. Specifically, the punch and/or the substrate 12 are heated to an elevated temperature. The punch is then applied to the substrate 12 to form the grooves 14 and the holes 18 in the substrate. The punch is removed and the electrical components are inserted into the cavities 18 in the substrate 12. The grooves 14 are subsequently filled or at least partially filled with the solder 16 to establish electrical continuity with the components.

If a long lasting punch is desired while using the method discussed in the previous paragraph, the punch produced after the removal of the undesired portions of the plate may be used to make a female mold with a pattern inverse to the pattern of the portion of the plate remaining on the punch. A final tool may be made from the female mold for application against the substrate 12 to form the grooves 14 and the cavities 18 in the substrate.

Figure 8:
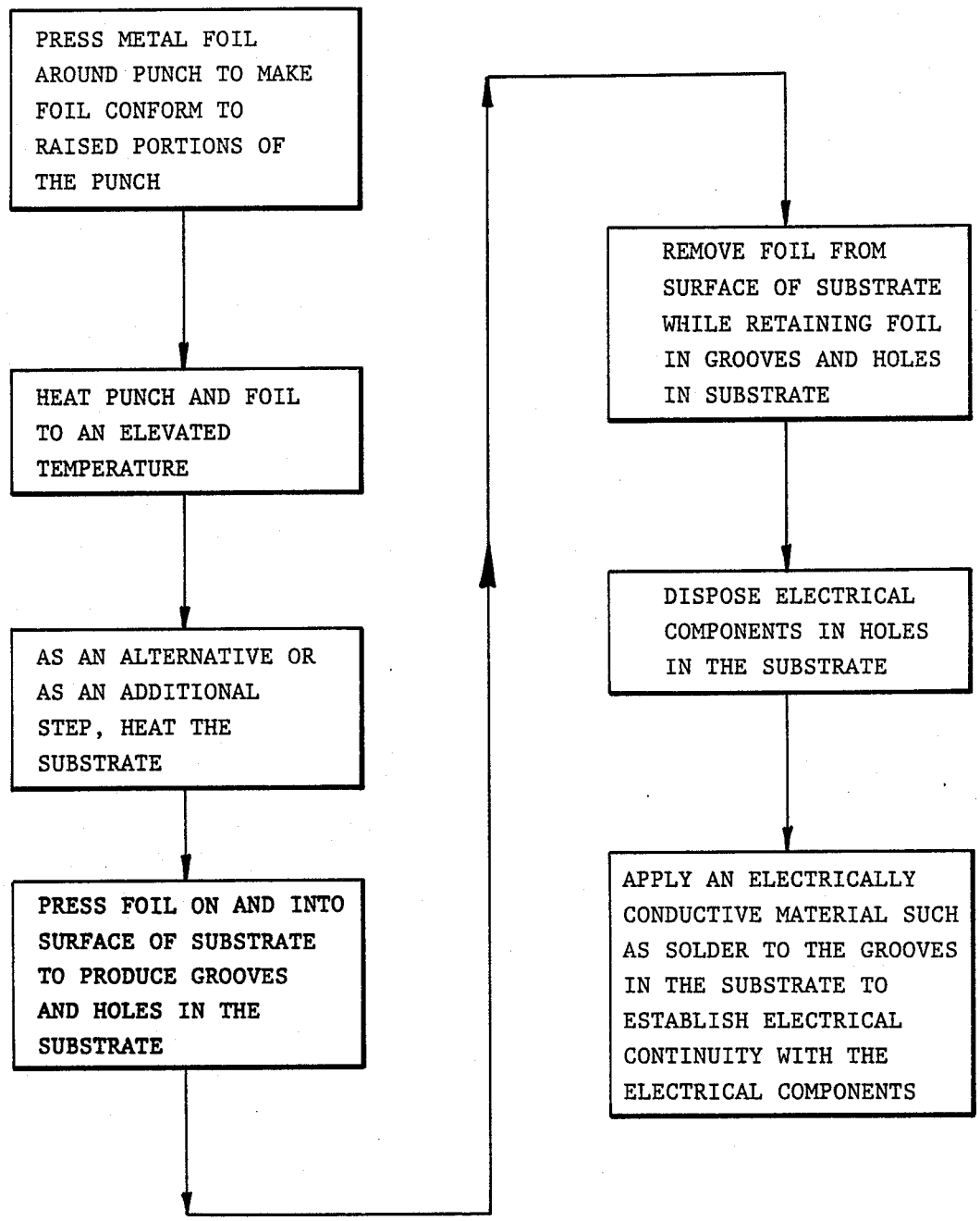

In FIG. 8, still another method is shown which is included within this invention. In this method, a punch 50 is provided with raised portions 52 corresponding to the grooves 14 and the holes 16 in the substrate. The raised portions 52 may be provided in the punch by any of the methods discussed above. A metal foil 54 may be then disposed on the punch to conform to the surface of the punch including the raised portions on the surface of the punch. Such conformation may be provided by disposing elastomeric material on the workpiece which presses the metal foil on the punch and by pressing the workpiece against the punch such that the elastomeric material presses against the foil.

The punch 50 and/or the metal foil 54 are then heated to an elevated temperature as described above. The foil 54 is then pressed by the punch on and into the substrate 12 to form the grooves 14 and the cavities 18 in the substrate. During the forming process, the foil becomes embedded in the substrate and adhered to the substrate. The foil is then removed from the substrate as by machining or printed circuit techniques such that only the portions of the foil in the grooves 14 remain. The electrical components may then be disposed in the cavities 18.

The foil 54 may be a suitable material such as copper. Because of this, the foil may constitute the electrical leads extending through the grooves 14 to establish electrical continuity with the electrical components in the cavities 18. Preferably, the grooves 14 are thereafter plated as with solder to insure that good electrical conductivity is established with the electrical components.

The methods described above and shown in the drawings have certain important advantages. One advantage is that the grooves 14 and the cavities 18 can be formed in the substrate 12 by a single stamping operation. This stamping operation is facilitated by heating the punch and/or the substrate. Furthermore, since successive ones of the substrates 12 are made by the same punch, substantial duplication of the grooves 14 and the cavities 18 in the successive ones of the substrates 12 is assured. The punch can be formed to define the grooves 14 and the holes 18 with great precision. In this way, printed circuit boards can be produced quickly and inexpensively with great precision in the location of electrical components and electrical leads and with optimal assurance that the electrical leads establish electrical continuity with the electrical components.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In a method of producing a printed circuit board, the steps of:
 providing a board from a material having properties of becoming deformed at local positions when subjected to heat and to pressure at such local positions,
 providing a punch with raised portions shaped to produce grooves and cavities in the printed circuit board at the local positions,
 heating at least the raised portions of the punch,
 applying the punch with the heated raised portions against the printed circuit board to produce the grooves and cavities, which are deeper than the grooves in the printed circuit board at the local positions,
 disposing electrical components in the cavities in the printed circuit board, and
 providing a conductive material in the grooves as leads communicating electrically with the electrical components in the cavities in the printed circuit board.

2. In a method as set forth in claim 1, wherein the electrical material at least partially fills the grooves and the grooves extend only partially through the board.

3. In a method as set forth in claim 2, the additional step of:
 heating the printed circuit board before the application of the punch against the printed circuit board, the depth of the grooves being at least as great as the widths of the grooves.

4. In a method as set forth in claim 1, the depth of the grooves being at least as great as the widths of the grooves.

5. In a method of producing a printed circuit board, the steps of:
 providing a punch having a substantially planar surface and having first raised portions extending only a relatively small distance from the planar surface and having second raised portions extending a relatively great distance from the planar surface,
 providing a substrate having a substantially planar surface, the substrate being made from a material having properties of becoming recessed at the respective positions on the planar surface of the first and second raised portions and in accordance with the respective extensions of the first and second raised portions from the planar surface,
 heating at least the first and second raised portions of the punch,
 applying the punch with the heated first and second raised portions to the planar surface of the substrate to produce grooves in the substrate at the positions of the first raised portions and in accordance with the extension of the first raised portions from the planar surface and to produce cavities in the substrate at the positions of the second raised portions and in accordance with the extensions of the second raised portions from the planar surface,
 disposing electrical components in the cavities in the substrate, and
 disposing an electrical material in the grooves in the substrate in communication with the components in the cavities to provide an electrical continuity with such electrical components.

6. In a method as set forth in claim 5, the additional step of:
 heating the substrate before the application of the punch to the planar surface of the substrate.

7. In a method as set forth in claim 6 wherein, the depths of the grooves are at least as great as the widths of the grooves.

8. In a method as set forth in claim 5, wherein the components fit snugly in the cavities and have electrical terminals and wherein the conductive material at least partially fills the grooves and communicate electrically with the components in the cavities.

9. In a method of producing a printed circuit board, the steps of:
 providing a substrate having a planar surface and made from a material providing for the production of grooves and cavities in the planar surface of the board,
 providing a punch having a planar surface and having first portions raised from the planar surface by a distance in the order of three mils (3 m) to twenty five mils (25 m) to produce the grooves and having second raised portions to produce the cavities,
 applying the punch to the planar surface of the substrate to produce in the substrate grooves having a depth in the order of three (3) mils (3 m) to twenty five mils (25 m) to produce the cavities, which are deeper than the grooves disposing electrical components in the cavities in the substrate, and
 applying an electrically conductive material to the grooves in electrical communication with the electrical components in the cavities.

10. In a method as set forth in claim 9 wherein the depths of the grooves are at least as great as the widths of the grooves.

11. In a method as set forth in claim 10, the additional step of:
 heating at least the first and second portions of the punch before the application of the punch to the planar surface of the substrate.

12. In a method as set forth in claim 11, the additional step of:
 heating the substrate before the application of the punch to the planar surface of the substrate to facilitate the formation of the grooves and cavities in the substrate.

13. In a method of producing a printed circuit board, the steps of:
 providing a substrate having a planar surface and made from a material having properties of becoming deformed at local positions when subjected to heat and to pressure at such local positions,
 providing a punch with a planar surface and with raised portions extending from the planar surface and shaped to produce grooves and cavities in the printed circuit board at the local positions,
 disposing an electrically conductive foil on the planar surface and the raised portions of the punch, applying the punch against the substrate to dispose the foil on the planar surface of the substrate and to define the cavities in the planar surface at first particular ones of the local positions and to define the grooves in the planar surface at second particular ones of the local positions for receiving the foil at the positions of the raised portions in the punch, the cavities being deeper than the grooves, removing the portions of the foil at the planar surfaces of the substrate except for the second particular ones of the local positions, disposing electrical components in the cavities in the substrate, and disposing electrically conductive material on the foil in the grooves in the substrate in communication with the electrical components in the cavities.

14. In a method as set forth in claim 13, the additional step of:

the punch being provided with first raised portions to define the grooves and with second raised portions extending further from the planar surface of the punch than the first raised portions to define the cavities, and heating the punch at the positions of the first and second raised portions before the application of the punch to the substrate.

15. In a method as set forth in claim 14, the additional step of:

plating the portions of the foil remaining on the substrate after the removal of the portions of the foil on the planar surface of the substrate except for the positions of the grooves.

16. In a method as set forth in claim 13, the additional step of:

heating the substrate before the application of the punch to the planar surface of the substrate.

17. In a method of producing a printed circuit board, the steps of:

providing a substrate having properties of forming grooves and cavities at particular positions in the substrate when subjected to heat and to forces at such particular positions for depressing the substrate, forming a punch with first raised portions at individual ones of the particular positions to produce the grooves and with second raised portions at other ones of the particular positions to produce the cavities, heating at least a particular one of the punch and the substrate, applying the punch against the substrate to form the grooves at the individual ones of the particular positions and the cavities which are deeper than the grooves, at the other ones of the particular positions in the substrate, disposing electrical components in the cavities in the substrate, and disposing electrically conductive material in the grooves in communication electrically with the components in the cavities.

18. In a method as set forth in claim 17, the punch being heated before the application of the punch to the substrate to produce the cavities and the grooves in the substrate, the depths of the grooves being at least as great as the widths of the grooves.

19. In a method as set forth in claim 18, the substrate being heated before the application of the punch to the substrate to produce the cavities and the grooves in the substrate, the depths of the grooves being at least as great as the widths of the grooves.

* * * * *